(12) United States Patent
Bijnen et al.

(10) Patent No.: US 8,908,152 B2
(45) Date of Patent: Dec. 9, 2014

(54) LITHOGRAPHIC APPARATUS AND DEVICE MANUFACTURING METHOD TO DETERMINE IMPROVED ABSOLUTE POSITION OF EXPOSURE FIELDS USING MARK STRUCTURES

(75) Inventors: Franciscus Godefridus Casper Bijnen, Valkenswaard (NL); Jozef Cornelis Antonius Roijers, Veldhoven (NL); Patrick Warnaar, Tilburg (NL); Marc Van Kemenade, Waalre (NL); Hoite Pieter Theodoor Tolsma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1134 days.

(21) Appl. No.: 12/621,143

(22) Filed: Nov. 18, 2009

(65) Prior Publication Data

US 2010/0123886 A1    May 20, 2010

Related U.S. Application Data

(60) Provisional application No. 61/115,776, filed on Nov. 18, 2008.

(51) Int. Cl.
*G03B 27/32* (2006.01)
*G03F 9/00* (2006.01)

(52) U.S. Cl.
CPC ............ *G03F 9/7049* (2013.01); *G03F 9/7003* (2013.01); *G03F 9/7076* (2013.01); *G03F 9/7084* (2013.01)
USPC .......................................................... 355/77

(58) Field of Classification Search
USPC .................................................... 355/77, 53
See application file for complete search history.

(56) References Cited

U.S. PATENT DOCUMENTS

| 4,823,012 A | 4/1989 | Kosugi |
| 5,333,050 A | 7/1994 | Nose et al. |
| 6,855,997 B2 | 2/2005 | Suwa |
| 7,019,814 B2 | 3/2006 | Best et al. |

(Continued)

FOREIGN PATENT DOCUMENTS

JP          63-013329 A     1/1988

(Continued)

OTHER PUBLICATIONS

English-Language Translation of Notice of Reasons for Rejection directed to related Japanese Patent Application No. 2009-257618, mailed Nov. 28, 2011, from the Japanese Patent Office; 4 pages.

*Primary Examiner* — Chia-how Michael Liu
(74) *Attorney, Agent, or Firm* — Sterne, Kessler, Goldstein & Fox P.L.L.C.

(57) ABSTRACT

A method for manufacturing a device includes providing a substrate, the substrate including a plurality of exposure fields, each exposure field including one or more target portions and at least one mark structure, the mark structure being arranged as positional mark for the exposure field; scanning and measuring the mark of each exposure field to obtain alignment information for the respective exposure field; determining an absolute position of each exposure field from the alignment information for the respective exposure field; determining a relative position of each exposure field with respect to at least one other exposure field by use of additional information on the relative parameters of the exposure field and the at least one other exposure field relative to each other; and combining the absolute positions and the determined relative positions into improved absolute positions for each of the plurality of exposure fields.

22 Claims, 8 Drawing Sheets

(56) References Cited

U.S. PATENT DOCUMENTS

| | | |
|---|---|---|
| 7,889,314 B2 | 2/2011 | Koenen |
| 7,894,063 B2 | 2/2011 | Van Bilsen et al. |
| 2009/0033948 A1 | 2/2009 | Kondo |

FOREIGN PATENT DOCUMENTS

| | | |
|---|---|---|
| JP | 04-212002 A | 8/1992 |
| JP | 07-142326 A | 6/1995 |
| JP | 08-037148 A | 2/1996 |
| JP | 2000-021754 A | 1/2000 |
| JP | 2001-166454 A | 6/2001 |
| JP | 2002-100557 A | 4/2002 |
| JP | 2002-134397 A | 5/2002 |
| JP | 2003-224049 A | 8/2003 |
| JP | 2004-200701 A | 7/2004 |
| JP | 2007-281449 A | 10/2007 |
| JP | 2009-152558 A | 7/2009 |
| WO | WO 2006/104011 A1 | 10/2006 |

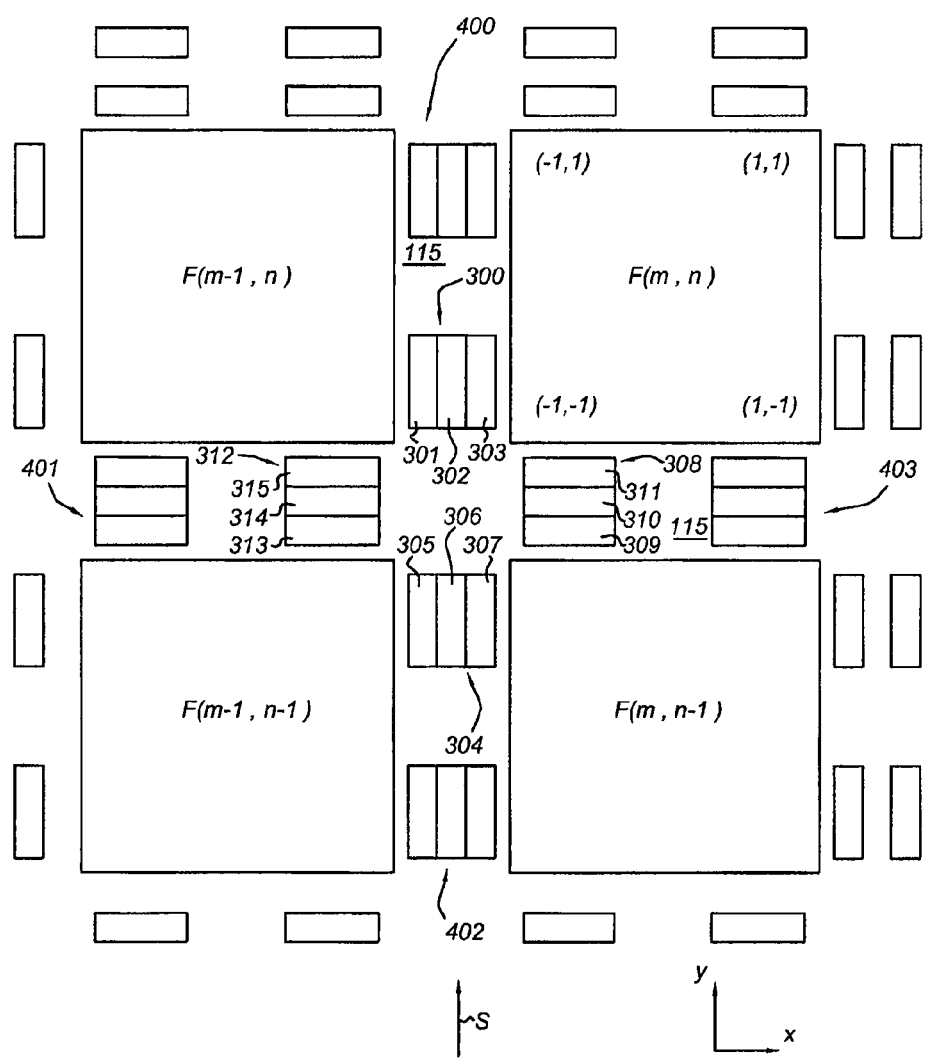

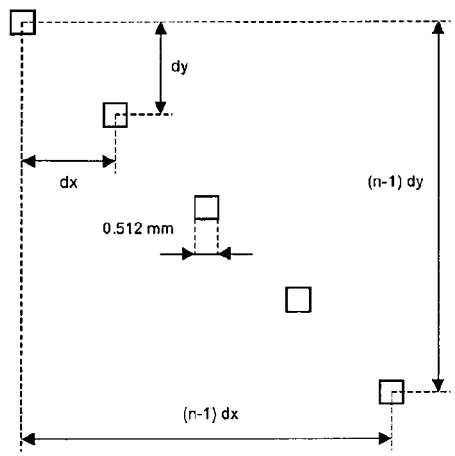
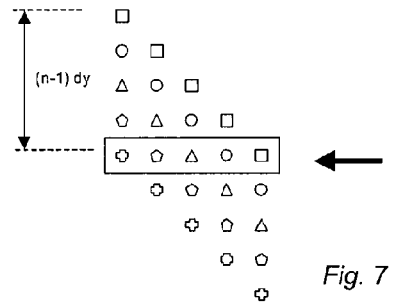
*Fig. 6*
*Fig. 7*
AA4 detection grid
AA5 detection grid
*Fig. 8*
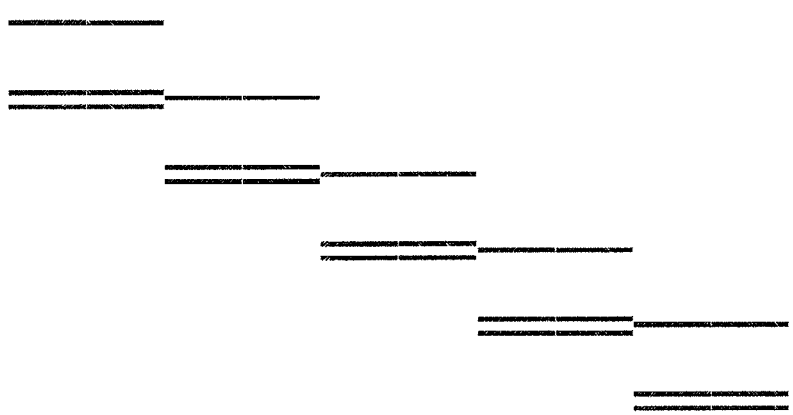
*Fig. 9*

BF8uH(PO3)=BF16uH(PO6)

BF8uH(PO2)= BF16uH(PO4)

|←  8 um  →|

Printed into each other

Combining BF3u2 with BF5u333 (AA5 and AA3 pitch)
Full subsegment overlap    Inner outer 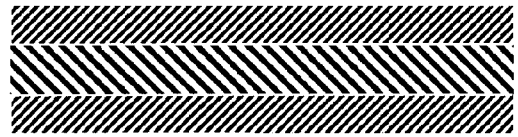
Combining BF2u666 with BF4u (AA6 and AA4 pitch)
 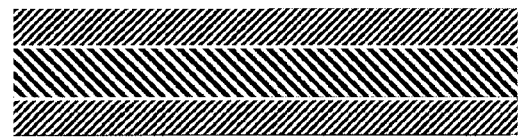
*Fig. 13*
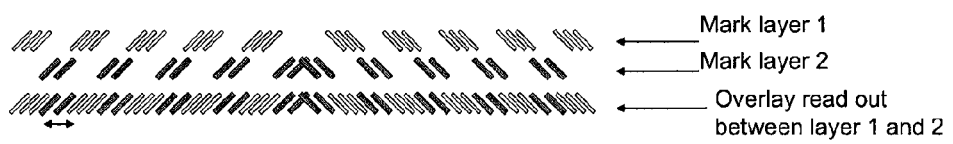
*Fig. 14*
 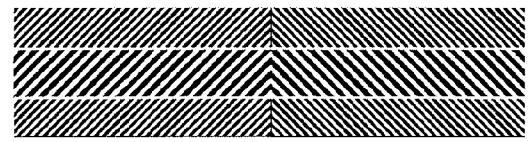
*Fig. 15a*   *Fig. 15b*
 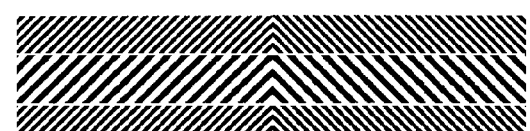
*Fig. 15c*   *Fig. 15d*

LITHOGRAPHIC APPARATUS AND DEVICE MANUFACTURING METHOD TO DETERMINE IMPROVED ABSOLUTE POSITION OF EXPOSURE FIELDS USING MARK STRUCTURES

CROSS-REFERENCE TO RELATED APPLICATIONS

The present application claims the benefit under 35 U.S.C. §119(e) of U.S. Provisional Patent Application No. 61/115,776, filed Nov. 18, 2008, which is incorporated herein by reference in its entirety.

FIELD

Embodiments of the present invention relate to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It is important that each patterned layer of the IC has a certain sufficient alignment or overlay with the previous patterned layer(s) on which the layer is located with an alignment error as low as possible. To obtain such certain alignment, the lithographic apparatus includes an alignment system which determines the positions of one or more marks on the semiconductor substrate. Typically, each mark is associated with an exposure field. Such an exposure field may include one or more target portions (or dies) depending on the actual set up of the lithographic process.

A mark may be embodied as a grating. In that case, the alignment system uses a light beam that is aimed at the grating. A diffraction pattern is generated by the interaction of the light beam and the grating of the mark. A sensor of the alignment system is arranged for measuring diffraction orders in the diffraction pattern to obtain information relating to the position of the mark relative to a reference position on the substrate. From the position of the mark, the position of the corresponding target portion is determined. Then, upon exposure of the previously patterned layer, the target portion can be positioned so as to have a minimum alignment error when a next patterned layer is imaged on the substrate.

When a wafer is aligned, alignment data are determined based on the information from the diffraction pattern and refer to the positions of the marks in a wafer grid. A grid model, such as a higher order grid model, is used and the exposure positions for transferring the pattern to respective target portions are calculated. Such a method is useful in the case in which only a few locations on the wafer are measured.

The trend at present, however, is to have many more alignments per wafer and obtain alignment data from as many exposure fields as possible. With the increase of detection speed this will eventually lead to the situation that each exposure field will be measured to obtain alignment position information related to that respective exposure field.

Accordingly, the precision of alignment is fully determined by the precision of the sensor. It is considered that the alignment reproducibility of the sensor is the best position information one can obtain. The precision of the alignment and overlay is thus limited to the alignment reproducibility of the sensor. However, this approach will not be sufficient for ongoing efforts to improve overlay of the patterned layer with the previously patterned layer, in particular in view of the trend of reduction of feature sizes in integrated circuits.

SUMMARY

The inventors have discovered an alignment reproducibility which is better than the reproducibility of the sensor.

According to an aspect of the invention, there is provided a method for manufacturing a device, including: providing a substrate, the substrate including a plurality of exposure fields, each exposure field including one or more target portions and at least one mark structure, the at least one mark structure being arranged as a positional mark for the exposure field; scanning and measuring the at least one mark of each exposure field to obtain alignment information for the respective exposure field; determining an absolute position of each exposure field from the alignment information for the respective exposure field; determining a relative position of each exposure field with respect to at least one other exposure field by use of additional information on the relative parameters of the exposure field and the at least one other exposure field relative to each other; and combining the absolute positions and the determined relative positions into improved absolute positions for each of the plurality of exposure fields.

According to an aspect of the invention, there is provided a lithographic apparatus arranged to transfer a pattern from a patterning device onto a substrate, further arranged to carry out: providing a substrate, the substrate including a plurality of exposure fields, each exposure field including one or more target portions and at least one mark structure, the at least one mark structure being arranged as a positional mark for the exposure field; scanning and measuring at least one mark of each exposure field to obtain alignment information for the respective exposure field; determining an absolute position of each exposure field from the alignment information for the respective exposure field; determining a relative position of each exposure field with respect to at least one other exposure field by use of additional information on the relative parameters of the exposure field and at least one other exposure field relative to each other; and combining the absolute positions and the determined relative positions into improved absolute positions for each of the plurality of exposure fields.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the relevant art(s) to make and use the invention.

FIG. 5 depicts a layout of adjacent exposure fields printed next to each other in accordance with an aspect of the present invention;

FIG. 6 depicts a layout of a calibration reticle currently used;

FIG. 7 depicts the pattern of marks resultant on the wafer, after six exposures of the calibration reticle of FIG. 6, exposed with different offset positions in Y;

FIG. 8 depicts a type of mark used on a reticle used when carrying out a method according to an embodiment of the invention;

FIG. 9 depicts a reticle including the mark of FIG. 8;

FIGS. 12 to 15 each show other types of oblique sub-marks used in methods according to embodiments of the invention.

Figure 1:
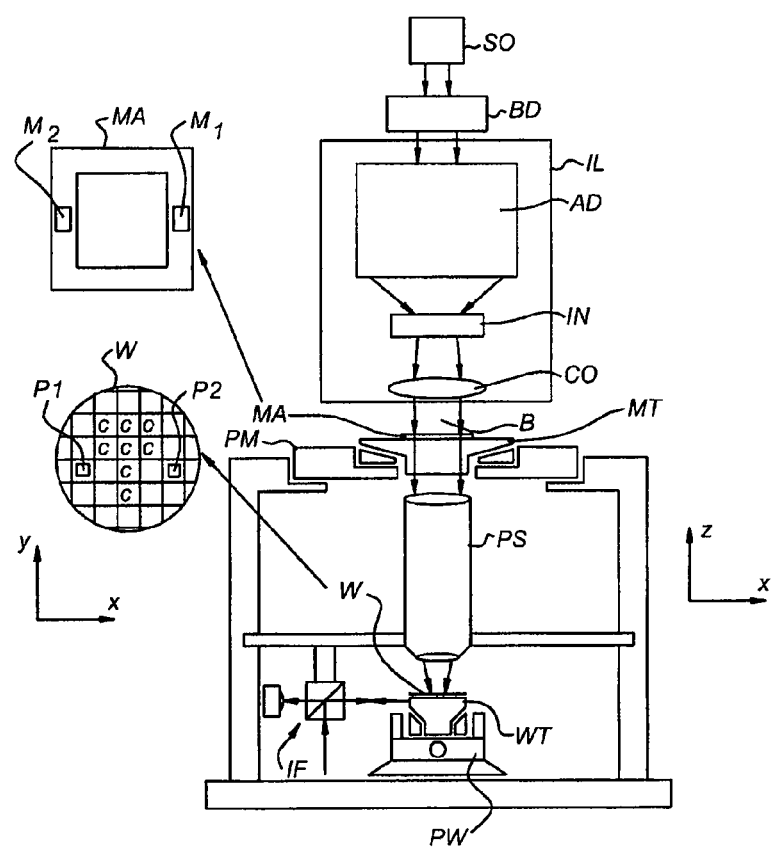
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the invention. The apparatus includes:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF (e.g. an interferometric device, linear encoder or capacitive sensor), substrate table WT can be moved accurately, e.g. so as to position different target portions C in the path of radiation beam B. Similarly, first positioner PM and another position sensor (which is not explicitly depicted in FIG. 1) can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In embodiments of the present invention it is recognized that the accuracy of the alignment position information for each exposure field can be improved when the alignment position information of the exposure field and additional associated position information relating to the exposure field and a neighboring exposure field are measured for each exposure field in a single scan. The additional associated position information between two exposure fields allows coupling of the mark positions of these exposure fields with a known precision, and allows calculation of the absolute positions of the fields with a higher accuracy than would be obtained from only the alignment position information.

A first exemplary lithographic apparatus, described below, includes an alignment system arranged to detect alignment data from measured exposure field positions and measured relative positions between neighboring pairs of exposure fields. The alignment system is also arranged to adjust the position of the substrate in accordance with the alignment data.

A second exemplary lithographic apparatus, described below, includes an alignment system arranged to detect alignment data from measured exposure field positions and a-priori field parameter knowledge that describes a relation from one exposure field position to a subsequently exposed other exposure field position. The alignment system is also arranged to adjust the position of the substrate in accordance with the alignment data.

The alignment system includes a sensor arranged to detect a mark response signal from a mark during measurement of the alignment. The mark response signal is a measure for the position of the mark.

The first example relates to an approach to determine in a single scan of the marks both the absolute position of the marks and the relative positions of marks from one or more neighboring exposure fields. In an embodiment, these relative positions can be determined in a single scan with a mark layout as presented in FIGS. 2a-2c.

Figure 2A:
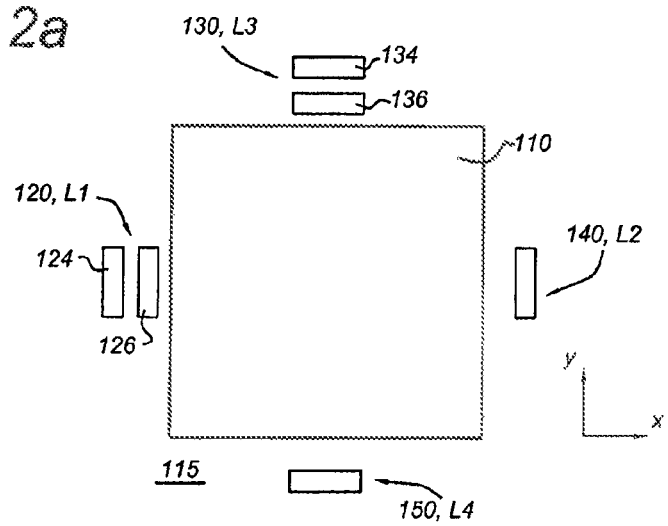
FIGS. 2a-2c depict a layout of a first mark structure in an exposure field in accordance with an aspect of the present invention.
Figure 2B:
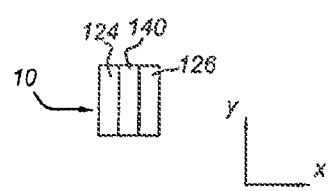
Figure 2C:
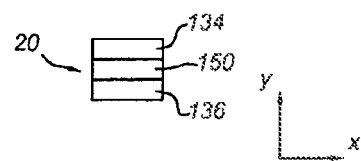

FIG. 2a depicts a layout of a first mark structure in an exposure field in accordance with an aspect of the present invention. FIG. 2b depicts a first composite mark created in a pair of adjacent exposure fields in accordance with an aspect of the present invention. FIG. 2c depicts a second composite mark created in a pair of adjacent exposure fields in accordance with an aspect of the present invention.

In FIG. 2a, a reticle layout of an exposure field 110 with associated marks 120, 130, 140, 150 is schematically shown. The marks associated with the exposure field are arranged in a scribe lane area 115 surrounding exposure field 110.

Typically, exposure field 110 has a right-angled shape that is directed along a first direction X and a second direction Y, second direction Y being substantially perpendicular to first direction X. According to an embodiment of the invention, a mark 120 is arranged at a first position L1 on a first side of the exposure field. Mark 120 includes a first sub-mark 124 and a second sub-mark 126. On a second side of the exposure field opposite to the first side, an accompanying mark 140 is arranged at a second position L2.

Second position L2 is correlated with first position L1 in order to have coincidence of the accompanying mark 140 of one exposure field with a mark 120 of another exposure field that is horizontally positioned next to the one exposure field in the first direction X. The coincidence of mark 120 of the other exposure field and accompanying mark 140 of the one exposure field is such that a composite mark including mark 120 and accompanying mark 140 as respective portions is formed.

FIG. 2b schematically shows the arrangement of first and second sub-marks 124, 126 from one exposure field and an accompanying mark 140 of the horizontally adjacent other exposure field as a first composite mark 10.

In a similar way, on a third side of the exposure field a mark 130 is arranged at a third position L3, as illustrated in FIG. 2a. Mark 130 includes a third sub-mark 134 and a fourth sub-mark 136. On a fourth side of the exposure field opposite to the third side, an accompanying mark 150 is arranged at a fourth position L4.

Likewise, the fourth position L4 is correlated with the third position L3 in order to have coincidence of the accompanying mark 150 of one exposure field with a mark 130 of another exposure field that is vertically positioned next to the one exposure field in the second direction Y.

FIG. 2c schematically shows the arrangement of third and fourth sub-marks 134, 136 from one exposure field and accompanying mark 150 of the vertically adjacent other exposure field as a second composite mark 20.

As will be explained in more detail below, within each composite mark the mark from the one exposure field is arranged to generate a first mark response signal to an (optical) scan while a second mark response signal will be generated by the accompanying mark from the adjacent other exposure field in the scan.

Furthermore, it is noted that within a composite mark, the mark from the one exposure field and the accompanying mark from the adjacent other exposure field may be arranged in a contiguous manner without any gap between the mark and the accompanying mark. Alternatively, the mark from the one exposure field and the accompanying mark from the adjacent other exposure field may be arranged with an intermediate gap.

In a non-limiting example, such an intermediate gap may be in the range from 0 (contiguous) to about 2 microns.

Figure 3A:
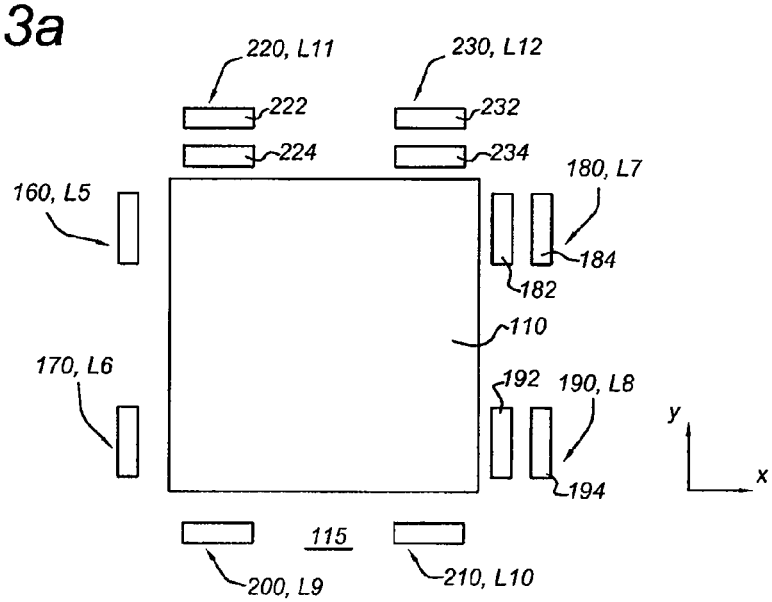
FIGS. 3a-3c depict a layout of a second mark structure in an exposure field in accordance with an aspect of the present invention.
Figure 3B:
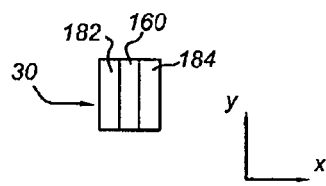
Figure 3C:
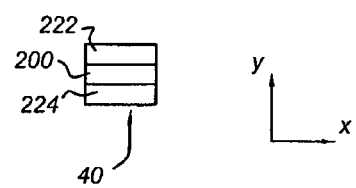

FIGS. 3a-3c depict a layout of a second mark structure in an exposure field in accordance with an aspect of the present invention.

The second mark structure includes in the scribe lane area 115 on the first side of exposure field 110 a mark 160 and mark 170 at locations L5 and L6 respectively, and on the second side opposite to the first side an accompanying mark 180 and an accompanying mark 190 at location L7 and location L8, respectively.

Further, the second mark structure includes in the scribe lane area 115 on the third side of exposure field 110 a mark 200 and mark 210 at locations L9 and L10 respectively, and on the fourth side opposite to the third side an accompanying mark 220 and an accompanying mark 230 at location L11 and location L12, respectively.

Position L5 is correlated with position L7 in order to have coincidence of the accompanying mark 180 of one exposure field with the mark 160 of another exposure field that is horizontally positioned adjacent to the one exposure field in the first direction X to form a third composite mark.

In a similar manner, position L6 is correlated with position L8 for the mark 170 of the one exposure field and the accompanying mark 190 of the other exposure field that is horizontally positioned adjacent to the one exposure field in the first direction X to form a composite mark.

Position L9 is correlated with position L11 in order to have coincidence of the accompanying mark 220 of one exposure field with the mark 200 of another exposure field that is vertically positioned next to the one exposure field in the second direction Y.

In a similar manner, position L10 is correlated with position L12 for the accompanying mark 230 of the one exposure field and the mark 210 of the other exposure field that is vertically positioned next to the one exposure field in the second direction Y.

Accompanying mark 180 includes a fifth sub-mark 182 and a sixth sub-mark 184. Likewise, the accompanying mark 190, accompanying mark 220 and accompanying mark 230 include seventh and eighth sub-marks 192, 194, ninth and tenth sub-marks 222, 224 and eleventh and twelfth sub-marks 232, 234, respectively.

The second mark structure (FIG. 3a) relates to a mark structure that in comparison to the first mark structure (FIG. 2a) may be more robust and precise due to the larger number of marks in the mark structure and due to the fact that the larger number of marks may provide redundancy in the alignment data.

FIG. 3b shows the arrangement of the mark 160 from one exposure field and the accompanying mark 180 of the horizontally adjacent other exposure field as a third composite mark 30.

FIG. 3c shows the arrangement of the mark 200 from one exposure field and the accompanying mark 220 of the vertically adjacent other exposure field as a fourth composite mark 40.

In a similar manner, composite marks are constructed for marks 170 and 210 and accompanying marks 190 and 230, respectively, as will be appreciated by the skilled person.

In the embodiments shown in FIGS. 2a-2c and 3a-3c, the mark from one exposure field includes two portions separated by a gap, in which the accompanying mark from the other adjacent exposure field is to be located.

Figure 4A:
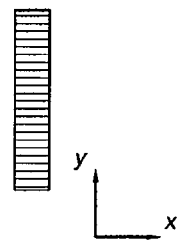
FIGS. 4a-4c depict various layouts of a mark in accordance with aspects of the present invention.
Figure 4B:
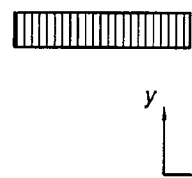
Figure 4C:
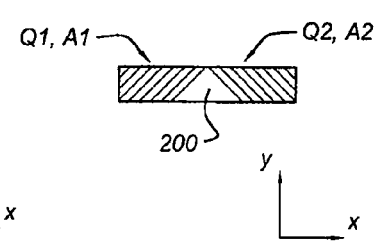

FIGS. 4a-4c depict various examples of a layout of a mark or sub mark according to embodiments of the present invention.

In an embodiment, marks 140, 150, 160, 170, 200, 210 or sub marks 124, 126, 134, 136, 182, 184, 192, 194, 222, 224, 232, 234 as used are diffraction gratings of a periodic structure such as a plurality of parallel lines separated from each other by a spacing. Such a periodic structure may be arranged to generate, during illumination by a light beam, a diffraction pattern extending along the first direction X, second direction Y or along a direction oblique to the X or Y direction.

FIG. 4a shows schematically a line grating suitable for diffraction along the Y-direction. Lines of the grating are arranged in parallel along the Y-direction and are extending along the X-direction.

FIG. 4b shows schematically a line grating suitable for diffraction along the X-direction. Lines of the grating are arranged in parallel along the X-direction and are extending along the Y-direction.

Alternatively, the periodic structure of the grating may be arranged to generate, during illumination by a light beam, a diffraction pattern extending at an oblique angle in comparison to first direction X and second direction Y.

FIG. 4c shows schematically a grating suitable for diffraction along both X and Y directions. Such a grating includes a plurality of parallel lines that extend in a direction oblique to both the first and second directions X, Y. The plurality of parallel lines may be partitioned in a first portion Q1 under a first oblique angle A1 with the X and Y directions and a second portion Q2 under a second oblique angle A2 with X and Y directions. Second oblique angle A2 is different from first oblique angle A1.

In a further embodiment, first oblique angle A1 is mirrored in X or Y direction to second oblique angle A2.

The skilled person will appreciate that types and/or shapes of gratings other than those shown in FIGS. 4a-4c may be used as well.

Composite marks 10, 20, 30, 40 may be formed in the scribe lanes of a wafer by using a mark structure such as the first mark structure as shown in FIGS. 2a-2c or the second mark structure as shown in FIGS. 3a-3c on the wafer to create a pattern of a plurality of exposed fields.

Since a composite mark 10, 20, 30, 40 is constructed of an arrangement of a mark from one exposure field arranged for generating a first mark response signal and an accompanying mark from an adjacent other exposure field arranged for generating a different second mark response signal, it is possible to measure in one single scan alignment position information from the one exposure field and further alignment position information from the adjacent other exposure field at one position of a composite mark.

For example, the mark 120 from the one field is measured in the same scan as the accompanying mark 140 from the other exposure field. In the scan the composite mark 120, 140 is exposed to a light beam, which diffracts on the composite mark. A sensor that is capable of determining the position of different diffraction orders in the diffracted light measures the diffracted light as the various diffraction orders. To allow distinction of signals originating from mark 120 from signals originating from accompanying mark 140, either the periodic structure of mark 120 is different from the periodic structure of accompanying mark 140, or the oblique angle is different between the mark from the one exposure field and the accompanying mark from the adjacent other exposure field in such a way that in the scan direction illumination of the mark from the one exposure field results in a modulated detection signal with a different modulation period than the modulated detection signal as generated by illumination of the accompanying mark from the adjacent other exposure field.

In this manner, light diffracted from the composite mark includes two different mark response signals, the first mark response signal relating to the mark of the one exposure field and the second mark response signal relating to the accompanying mark from the adjacent other exposure field.

For example, the mark of the one exposure field may have a periodic structure which at a given wavelength of the light beam generates substantially modulated light in the scan direction of a fifth diffraction order, while the accompanying mark may have an accompanying periodic structure which at the wavelength of the light beam generates substantially modulated light of the seventh diffraction order. Such two diffraction orders in the modulated light can be separated spatially and measured individually.

From measurements of the composite mark in the same scan, information on the absolute position of the one exposure field and the adjacent exposure field associated with the composite mark is obtained. Additionally, information on the position of the one exposure field and the position of the adjacent exposure field relative to each other is obtained. Since the relative position measurements for each exposure field are done simultaneously in one scan, the positional reproducibility error (for the mark and the accompanying mark) is the same. By consequence, the precision is determined by the sensor reproducibility error from one modulation signal to another modulation signal. In an example, the sensor reproducibility error may be about 10% of the absolute positional reproducibility error. Therefore, the relative positions of the exposure fields are determined with an improved precision which, as will be shown later, allows a determination of the absolute positions more accurately.

Moreover, at increased scan speeds and hence less stable scans, the relative field positions will be less affected than the absolute field positions since a differential method is used to eliminate common errors in the signal traces emerging from the same scan.

FIG. 5 depicts a layout of adjacent exposure fields printed next to each other to illustrate an embodiment of a method according to the present invention.

In FIG. 5, a number of exposure fields are shown, which are each constructed as shown in FIG. 3a. Four exposure fields F(m−1, n−1), F(m−1, n), F(m, n−1), F(m, n) from an array exposure fields on the wafer are shown. In the first direction X, exposure field F(m−1, n−1) is adjacent to exposure field F(m, n−1), and exposure field F(m−1, n) is adjacent to exposure field F(m, n). In the second direction Y exposure field F(m−1, n−1) is adjacent to exposure field F(m−1, n) and exposure field F(m, n−1) is adjacent to exposure field F(m, n). In the scribe lane area 115, composite marks 300, 304, 308, 312, 400, 401, 402, 403 are present which are constructed as explained above with reference to FIGS. 2a-2c and 3a-3c.

Composite mark 300 includes a mark 301, 303 from exposure field F(m−1, n) and an accompanying mark 302 from exposure field F(m, n). Likewise, composite mark 304 includes a mark 305, 307 from exposure field F(m−1, n−1) and an accompanying mark 306 from exposure field F(m, n−1). Composite mark 308 includes a mark 309, 311 from exposure field F(m, n−1) and an accompanying mark 310 from exposure field F(m, n). Composite mark 312 includes a mark 313, 315 from exposure field F(m−1, n−1) and an accompanying mark 314 from exposure field F(m−1, n).

A scan of composite mark 304 is indicated by arrow S. From this scan the following information can be obtained (it is assumed that marks 305, 306, 307 are oblique gratings):

1) absolute position information on the mark 305, 307 of field F(m−1, n−1) in X-direction and Y-direction, denoted $M_{x, m-1, n-1}$, $M_{y, m-1, n-1}$;

2) absolute position information on the accompanying mark 306 of field F(m, n−1) in X-direction and Y-direction, $M_{x, m, n-1}$, $M_{y, m, n-1}$ 3) relative position information of the two marks in X-direction and Y-direction, denoted $M_{rx}$, $M_{ry}$, wherein $M_{rx} = M_{x, m, n-1} - M_{x, m, n-1}$, and $M_{ry} = M_{y, m, n-1} - M_{y, m-1, n-1}$, In a similar way, the composite marks 300, 308 and 312 can be measured during the scan and similar absolute position information and relative position information can be obtained.

It will be appreciated that each exposure field on the wafer has at least one composite mark in relation to at least one other exposure field.

A method of wafer alignment for use with a mark structure of composite marks according an embodiment of the invention includes:

loading the wafer to the wafer stage. Using a composite mark according to an embodiment of the invention, this may occur with an accuracy of better than +/−40 micron.

capturing and coarse alignment of the wafer. This phase refines the position accuracy of the alignment marks of the wafer to within about 400 nm. This phase is executed by alignment to two X and two Y (COWA) marks and determines the four wafer parameters with the appropriate accuracy. The thus formed COWA (COarse Wafer Alignment) grid is used to calculate the expected positions of the FIWA (Fine Wafer Alignment) composite marks. The accuracy of the COWA grid should be sufficient to obtain an expected position which is within about 400 nm of a true FIWA composite mark position.

scanning and measuring the FIWA composite marks of a plurality of fields on the wafer, according to an embodiment of the invention;

determining the absolute mark positions of each of the plurality of fields on the wafer;

determining the relative mark positions of neighboring fields with respect to each other by use of information obtained during scanning on the relative position of the one exposure field and the adjacent exposure field relative to each other;

combining results of the absolute positions and the determined relative positions in a consistent way by taking into account the precision error values of the alignment data info, into improved absolute mark positions for each of the plurality of fields; and performing a next exposure of the wafer using the improved absolute positions for each of the plurality of exposure fields.

From each composite mark, differently modulated signals can be measured in the scanning direction. The scanning of oblique composite marks can be performed according to three different scan scenarios in accordance with embodiments of the present invention:

Scenario I: Scan all scribe lanes in both X and Y-direction (first and second direction). This will deliver the best overlay at the cost of throughput and may be useful for calibration purposes. Each exposure field has eight absolute X, Y position determinations and four unique relative X, Y position determinations. It is noted that each exposure field has a relative position determination for every absolute position (i.e. eight), but all these relative equations are shared with one of the adjacent exposure fields and thus four unique equations per field are left;

Scenario II: Scan only all X or all Y scribe lanes (first or second direction). The number of measurements is half of that of scenario I. Some loss in overlay is therefore compensated by a twice better throughput. Up to eight parameter field characterization is possible in this scheme since the number of absolute mark position determinations per field is eight. One of skill in the art will appreciate that a lower number field parameter characterization is also possible. A four parameter model may take into account translation x, translation y, magnification and rotation. A six parameter model may include translation x, translation y, magnification x, magnification y, rotation and non-orthogonality. For a four parameter model, at least four mark positions are used and for a six parameter model at least six mark positions are used.

Scenario III: Scan every other X or Y scribe lane (every other scribe lane in first direction or second direction). Scenario III restricts the number of measurements and scribe lanes to be scanned to a minimum. Nonetheless, marks from all fields are scanned (which is a minimum requirement), but every time at a different side of the field. Each exposure field is characterized by two absolute X, Y position determinations and one unique relative X, Y position as field parameters. Here, the impact of the a priori field to field parameter trend of the exposure fields that have been exposed directly after each other, and the precision at which this trend is known, have a larger impact on the final position/parameter determination of the fields.

In scenario III, optionally one additional scribe lane (in either X direction or Y direction, as chosen for this scenario)

is scanned. This additional scribe lane is positioned adjacent to one of the every other scanned scribe lanes while the additional scribe lane fulfills the condition that it crosses substantially over the center of the wafer. The scan over the additional scribe lane may improve the accuracy to determine the exposure field parameters in scenario III.

To determine mark positions from the measured (scanned) composite marks, the following exemplary method may be used.

Let Pm, n be a mark position for exposure field F(m, n). Let Mx, m, n, My, m, n be a measured value on the corresponding mark position in X-direction and Y-direction, respectively, and let am, n be a pointer to indicate to which adjacent exposure field the mark position relates and also if a scan was done at the mark position, using one of the scan scenarios.

In matrix form for all exposure fields on a wafer can be formalized as:

$$M = \Sigma \cdot P \qquad \text{[Eq. 1]}$$

where P is a matrix notation of mark positions $P_{i,j}$, M a matrix notation of the measured values $M_{x,i,j}$ and $M_{y,i,j}$, and $\Sigma$ a matrix notation of the pointer $\sigma_{i,j}$, for all measured exposure fields F(i, j).

A person having ordinary skill in the art will appreciate how to construct matrices P, $\Sigma$ and M. Also, it will be appreciated that Equation 1 describes a set of linear equations associated with an overdetermined system.

In that case, the solution to Equation 1 is given by:

$$P = (\Sigma^+ \Sigma)^{-1} \cdot \Sigma^+ \cdot M \qquad \text{[Eq. 2]}$$

where matrix $\Sigma^+$ is the transpose of matrix $\Sigma$, and $(\Sigma^+\Sigma)^{-1}$ denotes the inverse of matrix $(\Sigma^+\Sigma)$.

The solution has a property that the residual is minimized. The residual is given in matrix notation by:

$$R = M - \Sigma \cdot P \qquad \text{[Eq. 3]}$$

The solution of Equation 2 has a property that the overall residual is minimized according to Equation 4:

$$\Sigma\{\rho_{i,j}\}^2 \text{ is minimal.} \qquad \text{[Eq. 4]}$$

Typically the residual $\rho_{i,j}$ of exposure field F(i,j), independent of its origin, will be minimized assuming the same precision error. Therefore, Equation 4 does not reflect the different levels of precision at which the measurements/data are available.

To reflect the different levels of precision for these equations in dependence on the fact that a matrix element is associated with either determination of an absolute position or determination of a relative position, the least squares minimization is modified to minimize the following modified residual:

$$\Sigma\{\rho_{i,j}^{D(s)}\}^2 \qquad \text{[Eq. 5]}$$

where $$\rho_{i,j}^D = \rho_{i,j}/D(s)$$

and D(s) represents the precision error of the measurement. The measurement may be an absolute position measurement with an absolute position precision error Da, or a relative position measurement with a relative position precision error Dr. As discussed above the relative precision error is typically smaller than the absolute precision error.

Equation 1 can easily be modified to reflect this new constraint by evaluating:

$$\Sigma^D \cdot P = M^D \qquad \text{[Eq. 6]}$$

where $M^D$ is a matrix notation of the measured values $M_{x,i,j}$ divided by precision D(s), $M_{y,i,j}$ divided by precision D(s), and $\Sigma^D$ is a matrix notation of the pointer $\sigma_{i,j}$ divided by D(s), for all measured exposure fields F(i, j).

Solving Eq. 6 is now similar as before, thus:

$$P = (\rho^{D+}\Sigma^D)^{-1} \cdot \Sigma^{D+} \cdot M^D \qquad \text{[Eq. 7]}$$

The mark positions P calculated with Equation 7 are formed by taking into account the level of precision at which the measurements have been performed.

This results in more precise mark positions than when only the absolute positions would have been evaluated.

The field parameters which form the input for the new exposures can be calculated by implementing the solution P from Equation 7 into equations that define at least translation, magnification, rotation and non-orthogonality of each exposure field.

A person having ordinary skill in the art will appreciate that the form of the equations defining translation, magnification, rotation and non-orthogonality may depend on the actual layout and number of the composite marks for each exposure field.

In a further embodiment, a method may be arranged for use of alignment data from measured field positions and a-priori field parameter knowledge.

The a-priori field parameter knowledge describes a relation from one set of field parameters to parameters from another field. This relation provides a predictive trend of a functional relation between a set of field parameters of one exposure field and a set of parameters of another exposure field In a further embodiment, the a-priori field parameter trend may be a function of one or more process variable parameters.

The a-priori field parameter trend allows coupling of the mark positions of one exposure field and another exposure field with a known precision. The process variables may relate to any of the lithographic processing steps. Examples of a parameter based trend are temperature induced magnification trends and variation of the exposure lens. Such a trend may also be a function of process time.

Note that even without any detailed knowledge of the trend of the parameters, just knowledge of a field to field parameter precision error ($D_p$) may be the most important value to use in the matrix formalism as is illustrated below.

To describe an a-priori field parameter trend, equations can be set up at the parameter variability level to reflect the dependence of the parameters on the exposure routing of the layer to which alignment takes place. A-priori it can easily be established that on average after exposure of field F(m,n), the field parameters will change according to a trend with a delta $\Delta M$. This will affect another exposure field F(m2,n2) on the wafer. The change of field parameters is then given by $$Par_{m2,n2} - Par_{m,n} = \Delta M(s,m2,n2,m,n) \qquad \text{[Eq. 8]}$$

wherein $Par_{m2,n2}$ is a field parameter associated with field F(m2,n2), $Par_{m,n}$ is a field parameter associated a field F(m,n) which was exposed directly before or after field F(m2,n2), and $\Delta M(s,m2,n2,m,n)$ is the difference between the two field parameters, the difference being defined by the a-priori field parameter trend.

From Equation 8, the relations set out by Equation 1-Equation 7 can be used to calculate the mark position P for each exposure field with improved accuracy, by using the field parameters $Par_{i,j}$ for exposure field F(i,j) as measured values $M_{i,j}$. In this case, the precision error D(s) in Equations 5-7 is set equal to the field to field parameter precision error $D_p$.

The accuracy of the alignment position information for each exposure field can be improved when in a single scan the alignment position information of the exposure field is measured for each exposure field and additional associated position information relating to the exposure field and another (not necessarily neighboring) exposure field is calculated by use of the a-priori field parameter information. The additional associated position information between two exposure fields allows coupling of the mark positions of these fields with a known precision, and allows calculation of the absolute positions of the fields with a higher accuracy than would be obtained from only the alignment position information.

In an embodiment, the method of fine wafer alignment (FIWA) includes:

scanning and measuring FIWA marks of a plurality of fields on the wafer;

determining the absolute positions of the FIWA marks of each of the plurality of fields on the wafer;

determining relative positions of marks by performing at least one of a group including: determining all subsequently exposed field parameters with respect to each other by use of information obtained from a-priori field to field parameter knowledge describing a relation from one set of field parameters to another (subsequently exposed) set of field parameters, and determining relative mark positions of all neighboring exposed fields with respect to each other by use of composite marks, composed of marks from neighboring fields;

combining results of the absolute positions and the determined relative positions in a consistent way by taking into account the precision error values of the alignment data information into improved absolute positions for all fields;

determining the field parameters based on the improved absolute positions; and performing a next exposure of the wafer using the corrected absolute positions for each of the plurality of exposure fields.

In another embodiment the techniques described herein could be used in the calibration and set up of the lithographic system, which normally can take up to several days. The reason why this takes so long is partly because separate scans are required for X and Y calibration. The X and Y scans are usually performed on separate marks resulting in a shift between the X position determination and Y position determination. Often relative accuracy is required and this is often based on subtracting absolute determined positions.

Calibration is often performed in two distinct phases, absolute stage grid calibration (ASG), followed by stage grid verification. Considering ASG first, this uses a special reticle design to expose marks on a blank wafer at different Y-positions of the reticle, the marks' positions then being read for different positions of the wafer table.

FIG. 6 shows the layout of the calibration reticle. This includes n=5 marks on a diagonal.

FIG. 7 shows the pattern of marks on the wafer for Y setpoints with grid size dy. Each symbol corresponds to a different Y stage position at the exposure side. Note that the n=5 marks in the rectangle are all exposed with different stage Y positions at the exposure side. Also note that they can be read out with one stage Y position at the measure side. Differently stated, the 5 marks exposed with one stage Y position at the exposure side can be read with n=5 different stage Y positions at the measure area.

However, this ASG calibration read-out may use, for example, 8 hours measurement of these parameters, which is an undesirable amount of machine time. In particular, scanning positions in X and separately in Y is wasteful. Also, absolute position determination and subtraction to obtain relative position differences is rather inaccurate since two times the alignment noise is involved.

FIG. 8 shows a mark used on a special reticle for ASG calibration according to an embodiment of the invention. Instead of using single marks on the reticle, this embodiment uses marks having oblique stitching marks: The lower and upper elements are of different pitches (in an embodiment, known alignment mark designs AA4 and AA5 respectively) and can be printed into each other. The oblique AA4 detection grid, having 2 segments of total length 320 µm provides, when scanned along the long direction, an X and Y position at a similar precision to a single position 80 µm long AA5 segment.

Figure 10:
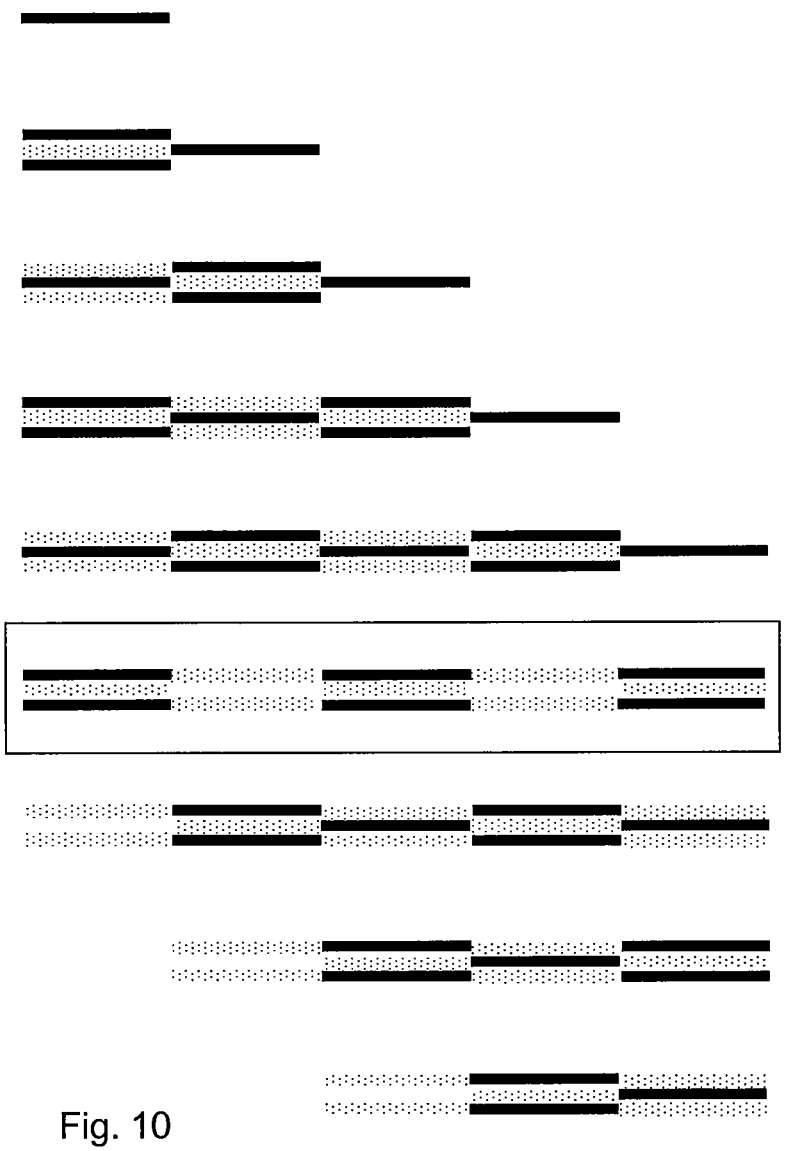
FIG. 10 depicts the pattern of marks resultant on the wafer, after six exposures of the calibration reticle of FIG. 9, exposed with different offset positions in Y.

FIG. 9 shows the special reticle with 5 of such marks on a diagonal as before. FIG. 10 shows the marks on the wafer exposed with different offset positions in Y, and is substantially the equivalent of the wafer marks shown in FIG. 7. As a consequence, a row of composite marks are exposed on the wafer (shown in a rectangle), including in each case sub-marks from different exposures (Alternate dark and light density has been used on marks from alternate exposures).

In an embodiment, alignment of these marks only needs to take place in a single direction. Such an embodiment is very suited for high speed alignment. Each composite mark results in 2 X positions, 2 Y positions, and the relative difference between both positions with an order to order precision. When performing alignment using a mark grating, intensity signals at half the pitch of the mark (first order), the 3rd order (half mark pitch/3), 5th order (half pitch/5), etc. result. This is the decomposition of a square pulse (the mark shape) into its Fourier components. It can be shown that the reproduction between those orders is improved (e.g., reproduction of (apos (3)-apos(5)) is typically 10 fold better than reproduction of apos(i), where apos (i) equals the aligned position of order i).

The reason for the better order to order reproduction is due to the common noise factors which are not subtracted in the order to order reproduction. This order to order precision, 10 times better than standard precision, is obtained since the noise for the AA4 trace is equal to that of the (simultaneously scanned) AA5 trace. The delta position in X as in Y, (that is the distance between the position of both orders, derived from different marks, and which also represents the distance between both marks) is thus obtained with a far better precision than by measuring first one position, then the other and then determining the difference. It should be appreciated that types of alignment marks other than AA4 and AA5 can be used in this embodiment.

It should be noted that a scan along the five composite marks inside the rectangle of FIG. 10 provides a single long scan, five times XdX, YdY, XdY and YdX corresponding to the differences between 6 different exposure positions.

Figure 11A:
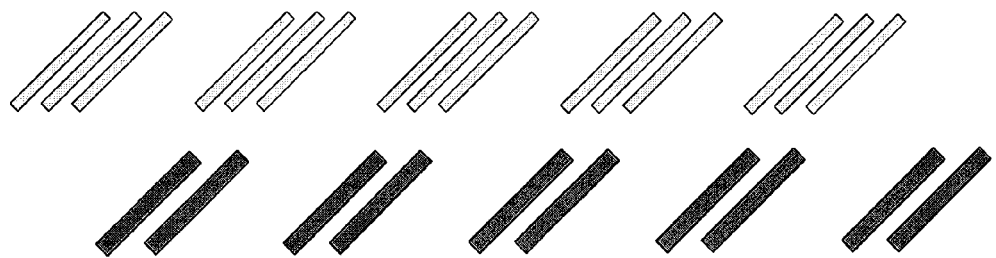
FIG. 11a shows other types of oblique sub-marks used in a method according to an embodiment of the invention.
Figure 11B:
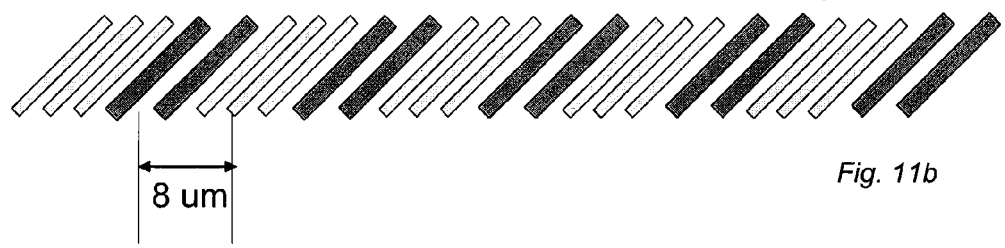
FIG. 11b shows the marks of FIG. 11a stitched together in subsequent exposures to obtain a composite mark.

It was stated above that different types of marks can be used than those illustrated. FIG. 11a shows another type of oblique sub-marks, which can be stitched together in subsequent exposures to obtain the composite mark shown in FIG. 11b. The width of the mark structure to be aligned is still about 38 µm. This mark layout is independent of the sensor spot diameter of the alignment system, and it does not suffer from mark edge effects in the centre of the detected signal.

The use of composite oblique marks in machine set-up allows more accurate, faster and reliable results as compared to the current practice. Comparing the new method with the old method for XY calibration, and calculating the impact on measurement time for a grid density of 1×1 mm, it can be simply demonstrated that an decrease of read-out time of about factor 2 will result, since only scans in one direction need to be performed (x or y) Further improvement in accuracy is obtained as one does not need to stop-start, but one can continue scanning.

Figure 12:

However, in embodiments, this factor will be larger (expected factor 10) since one can perform undersampling: Only within a range of 1 mm is the information relevant. Currently 300 samples are used to determine an X or Y position from a 40 μm scan length scribelane mark (sample distance 150 nm). Taking the same number of samples to determine an x-y position of a 1 mm scan requires 1 sample every 1.5 μm (2×300 samples/1 mm). The speed of travel can thus be increased by factor 10 (from 3 mm/s to 30 mm/s), without the risk of taking too few samples and without the need to go to a higher sampling frequency. The total dwelling time over one of the 2 subsegments (500 μm each) should not be shorter than 10 ms due to low frequency noise components of 100 Hz. This, in combination with a higher sampling frequency (to obtain enough data points) means that the speed of alignment can further be improved to 500 μm/10 ms=50 mm/s. A further doubling of the speed can be achieved by a concatenated subsegment mark as shown in FIG. 12. By combining the resulting signals of all the elements of a subsegment (total length of each subsegment is ~1 mm) a speed of 1 mm/10 ms=100 mm/s can be achieved.

In an embodiment, the total dwelling time on a mark subsegment stays equal and the number of samples per mm grid can stay equal, hence the expected precision stays equal but the alignment time improves by factor 30 (from 3 mm/s to 100 mm/s). To provide a specific example, using a speed of 100 mm/s and for a 300 mm diameter wafer the total XY grid determination at a grid resolution of 1×1 mm becomes {300 mm*300 lanes}/{100 mm/s}=1000 seconds.

Once ASG calibration is complete then the calibration results are verified by a trace test where a trace is exposed on a wafer, the trace then being measured to check the validity of the calibrated grid. While this is an elegant way to expose a wafer, without needing to move the reticle, and determining the measurement grid, this method of detection relies on interpretation of amplitude signals towards position offset at nm level. This may prove to be difficult. Additionally only information relating to XdY and YdX is obtained, no information on XdX and YdY is therefore obtained.

According to an embodiment, the gratings can include a diffraction pattern having a plurality of diffraction elements each extending along at least one oblique angle in comparison to first direction X and second direction Y, the directions being orthogonal, such that alignment information can be obtained in both direction X and direction Y from said diffraction pattern. In this exemplary embodiment, the initial calibration includes the initial steps of exposing the substrate a plurality of times to form a plurality of composite marks, where each of the first and second mark portions are formed from different exposures. The initial exposing of the substrate can be performed using a reticle having a plurality of marks on a diagonal line, each of the marks including a first sub-mark that is a grating with a first periodic structure and a second sub-mark that is a grating with a second periodic structure. In one example the first periodic structure is different from the second periodic structure. According to an embodiment, the initial exposing can be performed when one of the reticle or substrate is held stationary, the subsequent scanning and measuring can be performed when the other of the reticle or substrate is held stationary.

An alternative embodiment involves exposing, for example, a 38 μm×30 mm (i.e. Full reticle length in Y) mark. 38 μm is chosen in this example as it is the sensor spot diameter of the exemplary alignment system. The shape of this oblique XY mark includes sections at +45 degrees and −45 degrees grid. This large mark is exposed in scanning mode with a slit of 0.5 mm to allow enough spatial resolution. The wafer is exposed in a way similar to that of a full field. Since X and Y are determined simultaneously from a single location, this allows the determination of XdX, YdY, XdY and YdX offset of the exposed pattern with respect to the measurement grid in a realistic exposure situation. Any systematic offsets induced by the reticle can easily be recognized due to their repetitive character. They can then be taken out to yield the measurement grid.

The full length 30 mm mark described above is a composite mark made up of marks exposed at different wafer positions and may resemble the concatenated mark of FIG. 12. Alternatively they may include different designs as shown in FIG. 13. The advantages of the two marks shown in FIG. 13 are that for every position on the mark an X and Y position can be determined (also here no relative position is determined). Note that these marks are different from those shown in FIGS. 11 and 12, (and also FIGS. 14 and 15, described below) in that their angles are oriented differently and they are printed in a single exposure.

Therefore, not only is the measurement grid tested but also the reticle (stage) induced offset. In contrast to the trace test, the reticle dynamic errors may be an undesired part of the results. However, these could be minimized by using a somewhat slower exposure scan speed. The measurement speed of this test is high and comparable with the (also fast) trace test described above, since alignment can be performed by running over the exposed mark as if it is running over a scribelane. There is no need for special calibrations, as with the trace test, to relate amplitude variations with nm offsets.

One of the advantages of the above embodiments is that for the mark structures which are exposed in two exposures accurate values for XdX, YdY, XdY, YdX are determined between the two exposures. These parameters are actually the most important from an overlay perspective. In device manufacturing methods using lithographic apparatus, overlay is an important factor in the yield, i.e. the percentage of correctly manufactured devices. Overlay is the accuracy within which layers are printed in relation to layers that have previously been formed. The overlay error budget will often be 10 nm or less, and to achieve such accuracy, the substrate must be aligned to the mask pattern to be transferred with great accuracy. One might expect an overlay determination improvement of factor 10 (corresponding to the order to order reproduction).

Overlay measurements are performed fairly often. They are often part of a recovery sequence and therefore any speed up of this test will shorten recovery time. Also the accuracy obtained in the present manner (about 1 nm) is limited and may in certain applications not be enough.

The current time to measure overlay on a wafer is typically 6-8 minutes. In an exemplary system, this overlay is determined on 44 fields and 25 (x,y) overlay data points result from this. A single field is then separated in 7 rows of 3 to 4 positions (in total 25). The accuracy of this measurement is based on subtraction of the data of two separate measurements. Alignment on one target gives a reproduction of about 1 nm and on the other target, also about 1 nm. Subtracting these independently measured values will result in a precision of the subtracted alignment signals of sqrt(1^2+1^2)=sqrt(2), and therefore accuracy is limited to about sqrt(2)*repro.

FIG. 14 shows a mark printed during the first layer exposure and a mark printed during the second layer exposure along with the overlay readout between layers 1 and 2.

In the above embodiments the overlay marks can be, for example, about 1 mm long. To avoid 100 Hz noise in such embodiments, the residence time on the concatenated mark subsegments should be about 10 ms. Thus alignment speed can be about 100 mm/s Undersampling (if required) is allowed without the loss of accuracy. Note that at 100 Khz sampling, no undersampling is required.

It should also be noted that the chosen approach for these calibration and overlay embodiments is independent for low (100 Hz) frequency disturbances because the mark length can be chosen optimally (e.g. 1 mm or longer). As said before, there are 44 fields (in say 6 rows per wafer) and 7 rows of marks per field. The total scan length is therefore 300 mm (one scan)*7×6=12 meter. Total overlay alignment time becomes 120 m/(100 mm/s)=2 minutes.

It is also apparent that a smart choice of mark positions can reduce the number of rows per field. Also, marks longer than 1 mm allow further increase of the alignment speed.

In a further embodiment alignment may be split between layers such that the X-positions of marks are aligned to a first layer and the Y-positions aligned to a (different) second layer (or vice versa). This is of particular use for contact layers which, for some products, make up a large part of all layers (30-50%).

For standard mark types (1 scan per alignment direction), alignment split in this way can easily be performed without any impact on throughput. For oblique marks this means that the advantage of aligning double the amount of positions in the same time frame is lost. This is because, while each layer contains an oblique mark, one scan provides only one useful directional position information, x or y. The other useful directional position information needs to be obtained from aligning to another oblique mark from a different layer. Therefore, this technique can equally be done using standard (uni-directional) marks.

Since it is advantageous to use a single type of mark design for each layer and the number of useful mark positions to be determined for a wafer in a given timespan should be kept equal, a few new mark types have been designed. With these mark types it stays possible to employ a single scan, and determine the X-position of layer 1 and the Y-position of layer 2 (or vice versa). This is performed by the printing layer 2 mark into the layer 1 mark as explained in the embodiments described previously.

FIGS. 15*a* to 15*d* show 4 exemplary types of new marks specifically designed for split alignment. FIGS. 15*a* and 15*b* each show marks of different types, each combining the known marks BF2u67 and BF4u0 (AA6 and AA4 pitch), while FIGS. 15*c* and 15*d* show marks of different types, each combining the known marks BF3u2 with BF5u33 (AA5 and AA3 pitch). Each design is printed in two exposures.

On a single scan each design gives 2× and 2 Y positions, that is X,Y of layer 1 and X,Y of layer 2. The X,Y positions of the two different layers are separated by order selective detection. For split alignment the aligned position (for exposure of layer 3) is composed of X from layer 1 and Y from layer 2 (or vice versa).

The type 1 design (FIGS. 15*a* and 15*c*), compared to the type 2 designs (FIGS. 15*b* and 15*d*), has an absence of mark edge signals in the recorded signal of type 2 (i.e. overlap of mark edges with the sensor spot of the alignment system).

Type 2 designs (FIGS. 15*b* and 15*d*), compared to the type 1 design (FIGS. 15*a* and 15*c*), have a lower level of order mixing (since the sub-marks are spatially separated) in the sensor spot of the alignment system.

Use of orders AA4 and AA6 as opposed to AA5 and AA3 for the type 1 design provides a more homogenous signal trace result. This is because AA6/AA4 is repetitive every 8 μm and AA5/AA3 is repetitive every 16 μm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a computer-readable data storage medium (e.g. semiconductor memory, magnetic or optical disk) having such a computer program stored therein. Such a computer program may be arranged for controlling the lithographic apparatus according to the method disclosed above.

The descriptions above are intended to be illustrative, not limiting. Thus, it will be apparent to one skilled in the art that modifications may be made to the invention as described without departing from the scope of the claims set out below.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for manufacturing a device, comprising:
providing a substrate, the substrate comprising a plurality of exposure fields, each exposure field comprising one or more target portions and at least one mark structure, the at least one mark structure being arranged as a positional mark for the exposure field;
scanning and measuring the at least one mark structure of each exposure field to obtain alignment information for the respective exposure field;
determining an absolute position of each exposure field from the alignment information for the respective exposure field and dividing the absolute position by an absolute position precision error;
determining a relative position of each exposure field with respect to at least one other exposure field by use of additional information on relative parameters of the exposure field and the at least one other exposure field relative to each other and dividing the relative position by a relative position precision error; and
combining the divided absolute position and the divided relative position into improved absolute position for each of the plurality of exposure fields.

2. The method according to claim 1, wherein:
the at least one mark structure is a composite mark comprising a first mark portion of one exposure field and a second mark portion of another exposure field, the other exposure field is adjacent to the one exposure field; and
the additional information on the relative position of the one exposure is determined from a difference of a position of the first mark portion and a position of the second mark portion.

3. The method according to claim 2, wherein the first mark portion is arranged for generating a first mark response signal and the second mark portion is arranged for generating a second mark response signal during measurement, the second mark response signal being different from the first mark response signal.

4. The method according to claim 2, wherein the first mark portion is a grating with a first periodic structure and the second mark portion is a grating with a second periodic structure, the first periodic structure being different from the second periodic structure.

5. The method according to claim 4, wherein said gratings comprise a diffraction pattern having a plurality of diffraction elements each extending along at least one oblique angle in comparison to first direction X and second direction Y, said directions being orthogonal, such that the alignment information can be obtained in both direction X and direction Y from said diffraction pattern.

6. The method according to claim 5, wherein each of said mark portions comprises gratings having a diffraction pattern extending at two oblique angles, ninety degrees apart.

7. The method according to claim 5, wherein said device is manufactured in a plurality of layers and said alignment information is used to determine improved positions for some or all of said plurality of layers, relative to other layers.

8. The method according to claim 5, wherein method steps are used in initial calibration to determine a reference grid for the substrate prior to manufacture of said device, said initial calibration including the initial steps of exposing the substrate a plurality of times to form a plurality of said composite marks, wherein each of said first and second mark portions are formed from different exposures.

9. The method according to claim 8, wherein said initial exposing of the substrate is performed using a reticle having a plurality of marks on a diagonal line, each of said marks comprising a first sub-mark that is a grating with a first periodic structure and a second sub-mark that is a grating with a second periodic structure, the first periodic structure being different from the second periodic structure.

10. The method according to claim 9, wherein said initial exposing is performed when one of the reticle or substrate is held stationary, the subsequent scanning and measuring step being performed when the other of the reticle or substrate is held stationary.

11. The method according to claim 10, wherein said scan is done on a single line of the composite marks, said line of the composite marks comprising at least one mark portion from each exposure.

12. The method according to claim 8, wherein further steps to verify said reference grid information are performed, said further steps comprising exposing a further mark comprised of a plurality of oblique sections, said further mark being substantially the reticle length in one of the X-direction or Y-direction; and determining parameters of any offset of the further mark with respect to the reference grid.

13. The method according to claim 2, further comprising:
illuminating the composite mark by a light beam, wherein light diffracted by the first mark portion is modulated substantially as light of one period while light diffracted by the second mark portion is modulated substantially as light of another period that is different from the one period.

14. The method according to claim 2, wherein:
the additional information on the relative position of the one exposure field and the other exposure field relative to each other is determined from an a-priori field to field parameter trend.

15. The method according to claim 14, wherein the a-priori field to field parameter trend is a functional relationship between a set of positions of the one exposure field and a set of positions of the other exposure field.

16. The method according to claim 14, wherein the a-priori field to field parameter trend is a function of one or more process variables as trend parameters, the process variables relating to the lithographic processing of the substrate.

17. The method according to claim 1, further comprising:
performing a next exposure of the substrate using the improved absolute positions for each of the plurality of exposure fields.

18. The method according to claim 1, wherein the combining comprises:
arranging values of the divided absolute position and values of the divided relative position into a set of linear equations for the plurality of exposure fields; and
solving the set of linear equations to produce an improved absolute parameter set including a position for each exposure field under minimization of a residual between the measured position data and the improved calculated positions for the plurality of exposure fields.

19. The method according to claim 18, wherein the relative position precision error for relative position is smaller than the absolute position precision error.

20. The method according to claim 1, wherein said device is manufactured in a plurality of layers, and wherein said alignment information is obtained in a single direction for each layer, said direction being orthogonal to that of the last layer for each successive layer.

21. A lithographic apparatus arranged to transfer a pattern from a patterning device onto a substrate, further arranged to carry out:
providing a substrate, the substrate comprising a plurality of exposure fields, each exposure field comprising one or more target portions and at least one mark structure, the at least one mark structure being arranged as a positional mark for the exposure field;
scanning and measuring at least one mark structure of each exposure field to obtain alignment information for the respective exposure field;
determining an absolute position of each exposure field from the alignment information for the respective exposure field and dividing the absolute position by an absolute position precision error;
determining a relative position of each exposure field with respect to at least one other exposure field by use of additional information on relative parameters of the exposure field and at least one other exposure field relative to each other and dividing the relative position by a relative position precision error; and
combining the divided absolute position and the divided relative position into improved absolute position for each of the plurality of exposure fields.

22. A lithographic apparatus arranged to transfer a pattern from a patterning device onto a substrate, further arranged to carry out a method comprising:
providing a substrate, the substrate comprising a plurality of exposure fields, each exposure field comprising one or more target portions and at least one mark structure; the at least one mark structure being arranged as a positional mark for the exposure field;
scanning and measuring at least one mark structure of each exposure field to obtain alignment information for the respective exposure field;
determining an absolute position of each exposure field from the alignment information for the respective exposure field and dividing the absolute position by an absolute position precision error;
determining a relative position of each exposure field with respect to at least one other exposure field by use of additional information on relative parameters of the exposure field and at least one other exposure field relative to each other and dividing the relative position by a relative position precision error; and
combining the divided absolute position and the divided relative position into improved absolute position for each of the plurality of exposure fields.

* * * * *